United States Patent
Fukushima et al.

(10) Patent No.: US 11,911,891 B2
(45) Date of Patent: Feb. 27, 2024

(54) ACTUATOR SYSTEM

(71) Applicant: THK CO., LTD., Tokyo (JP)

(72) Inventors: Katsuya Fukushima, Tokyo (JP); Masashi Ishii, Tokyo (JP); Hiroki Niwa, Tokyo (JP); Akira Suzuki, Tokyo (JP); Kazuto Oga, Tokyo (JP); Shogo Wakuta, Tokyo (JP); Satoshi Hara, Tokyo (JP); Tomofumi Mizuno, Tokyo (JP); Shigeki Hayashi, Kawasaki (JP)

(73) Assignee: THK CO., LTD., Tokyo (JP)

( * ) Notice: Subject to any disclaimer, the term of this patent is extended or adjusted under 35 U.S.C. 154(b) by 452 days.

(21) Appl. No.: 17/284,886

(22) PCT Filed: Oct. 17, 2019

(86) PCT No.: PCT/JP2019/040946
§ 371 (c)(1),
(2) Date: Apr. 13, 2021

(87) PCT Pub. No.: WO2020/080478
PCT Pub. Date: Apr. 23, 2020

(65) Prior Publication Data
US 2021/0387353 A1    Dec. 16, 2021

(30) Foreign Application Priority Data
Oct. 19, 2018   (JP) .................................. 2018-197709

(51) Int. Cl.
*B25J 9/00*    (2006.01)
*B25J 13/08*   (2006.01)
(Continued)

(52) U.S. Cl.
CPC ............... *B25J 13/085* (2013.01); *B25J 9/16* (2013.01); *B25J 15/0616* (2013.01); *G01L 5/226* (2013.01)

(58) Field of Classification Search
None
See application file for complete search history.

(56) References Cited

U.S. PATENT DOCUMENTS

| | | | |
|---|---|---|---|
| 2006/0184282 A1* | 8/2006 | Strasser | B65H 7/12 700/258 |
| 2012/0296469 A1 | 11/2012 | Yoshinaga et al. | |
| 2015/0258689 A1* | 9/2015 | Suzuki | B25J 9/1697 901/47 |

FOREIGN PATENT DOCUMENTS

| | | |
|---|---|---|
| JP | 3-23114 A | 1/1991 |
| JP | 2009-164347 A | 7/2009 |

(Continued)

OTHER PUBLICATIONS

International Search Report dated Dec. 24, 2019, issued in counterpart International Application No. PCT/JP2019/040946, w/English translation (4 pages).

*Primary Examiner* — Paul B Yanchus, III
(74) *Attorney, Agent, or Firm* — WHDA, LLP

(57) ABSTRACT

An actuator system that picks up workpieces aims to shorten tact time and to reduce damages to workpieces. The actuator system includes an actuator that picks up a workpiece, an external force detection sensor that detects a physical quantity that is correlated with an external force that is applied to the workpiece, a head unit that is connected to the actuator and the external force detection sensor without a communication network, the head unit being configured to control the actuator based on a sensing result from the external force detection sensor when a pickup request signal that is a signal requesting pickup of the workpiece is received, and a control (Continued)

device that is connected to the head unit over the communication network, the control device being configured to transmit the pickup request signal to the head unit.

6 Claims, 7 Drawing Sheets

(51) Int. Cl.
*B25J 9/16* (2006.01)
*B25J 15/06* (2006.01)
*G01L 5/22* (2006.01)

(56) References Cited

FOREIGN PATENT DOCUMENTS

| | | |
|---|---|---|
| JP | 2012-240166 A | 12/2012 |
| JP | 2013-107147 A | 6/2013 |
| WO | 2014/181451 A1 | 11/2014 |

* cited by examiner

[Fig. 1]
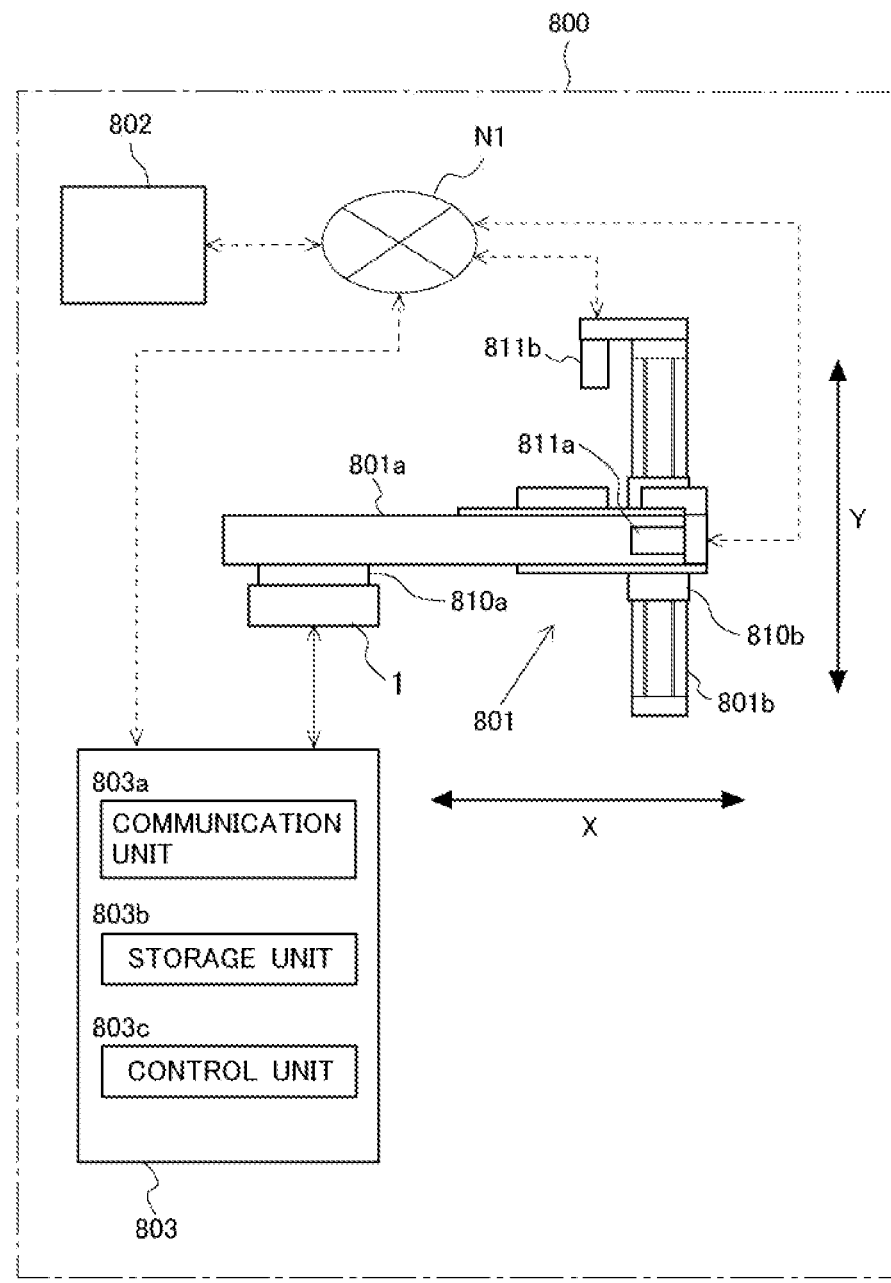

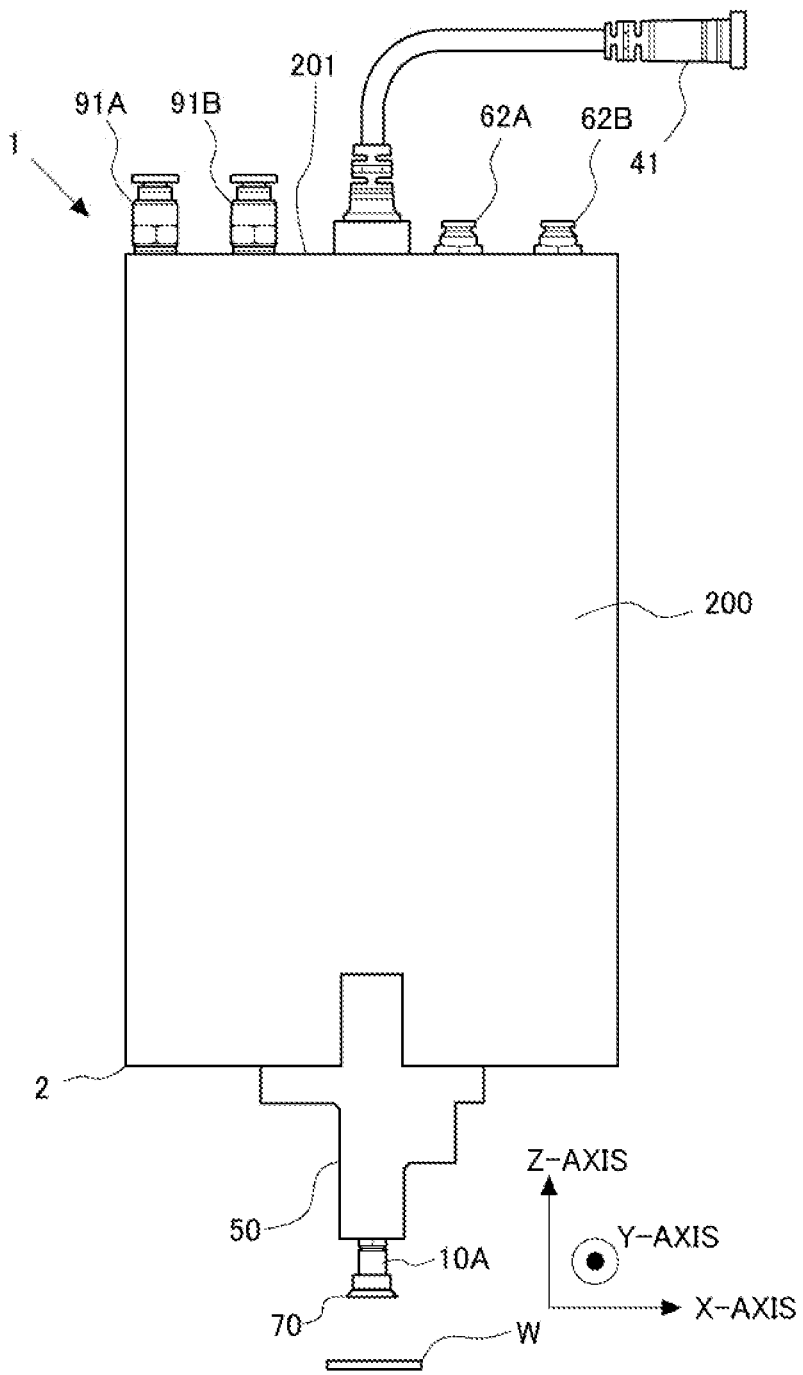
[Fig. 2]

[Fig. 3]
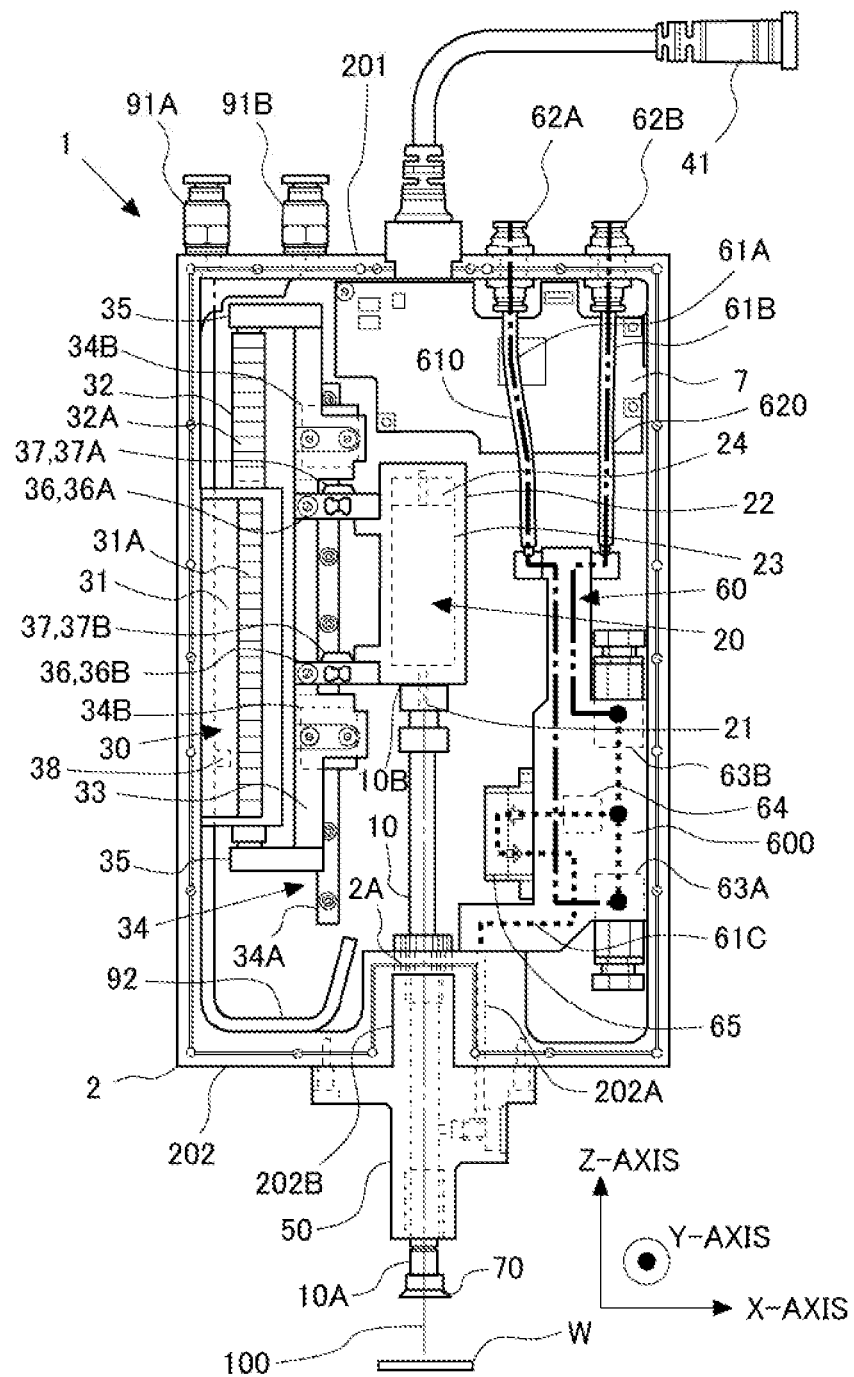

[Fig. 4]
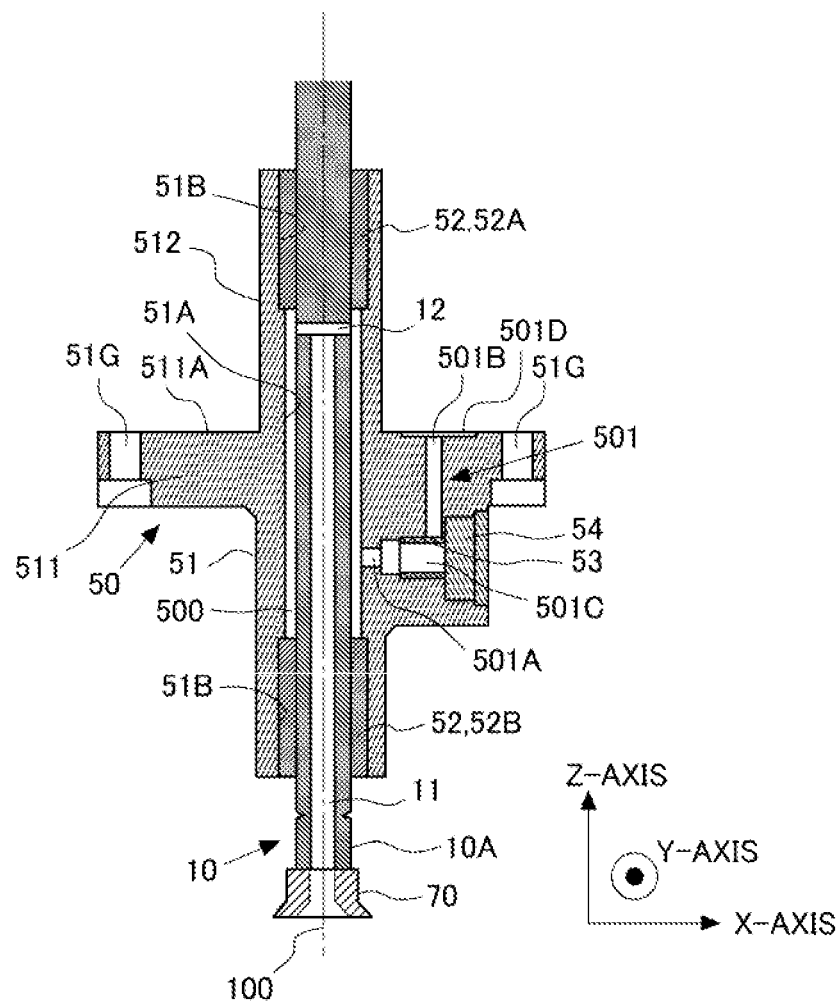

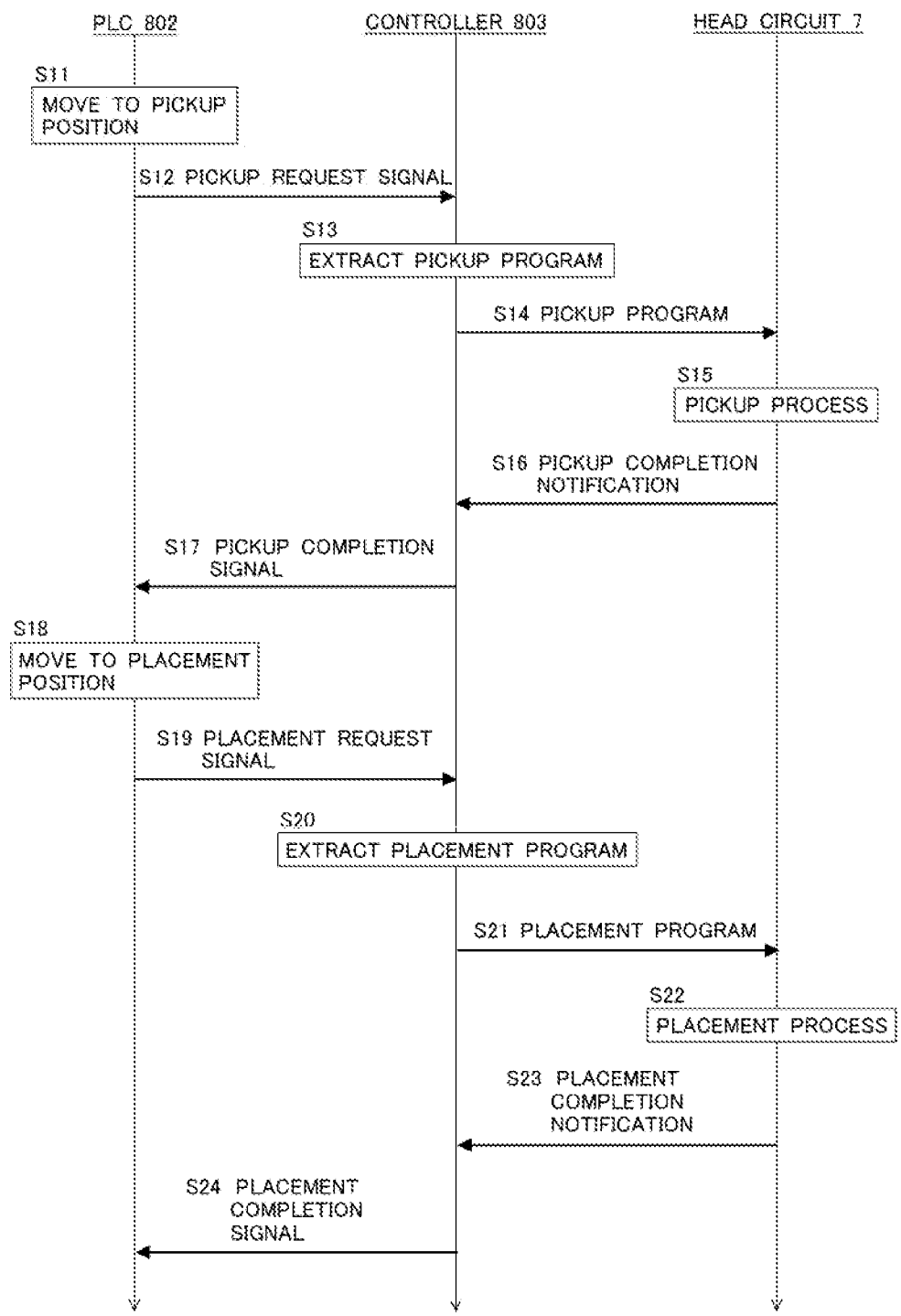

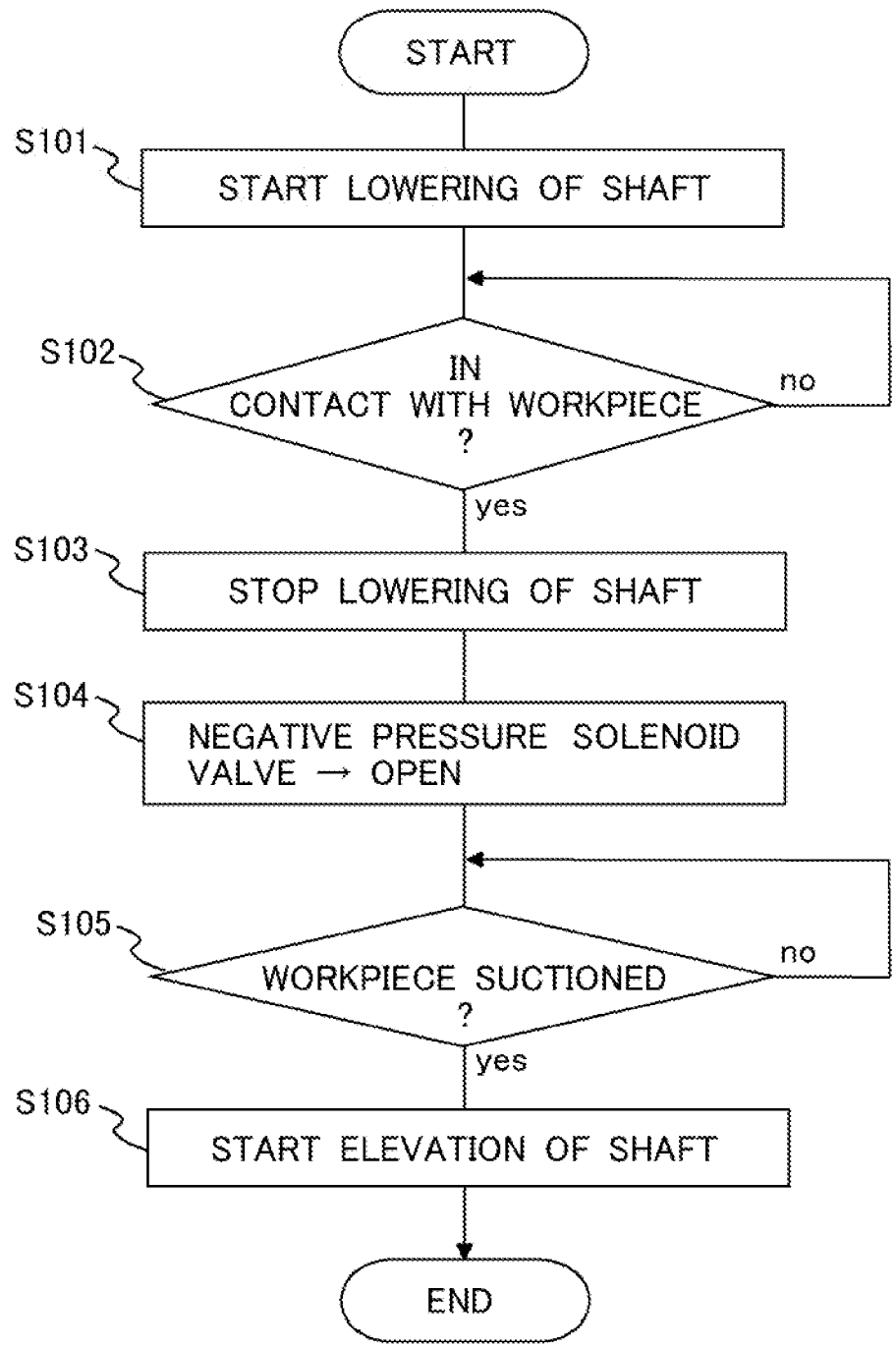
[Fig. 6]

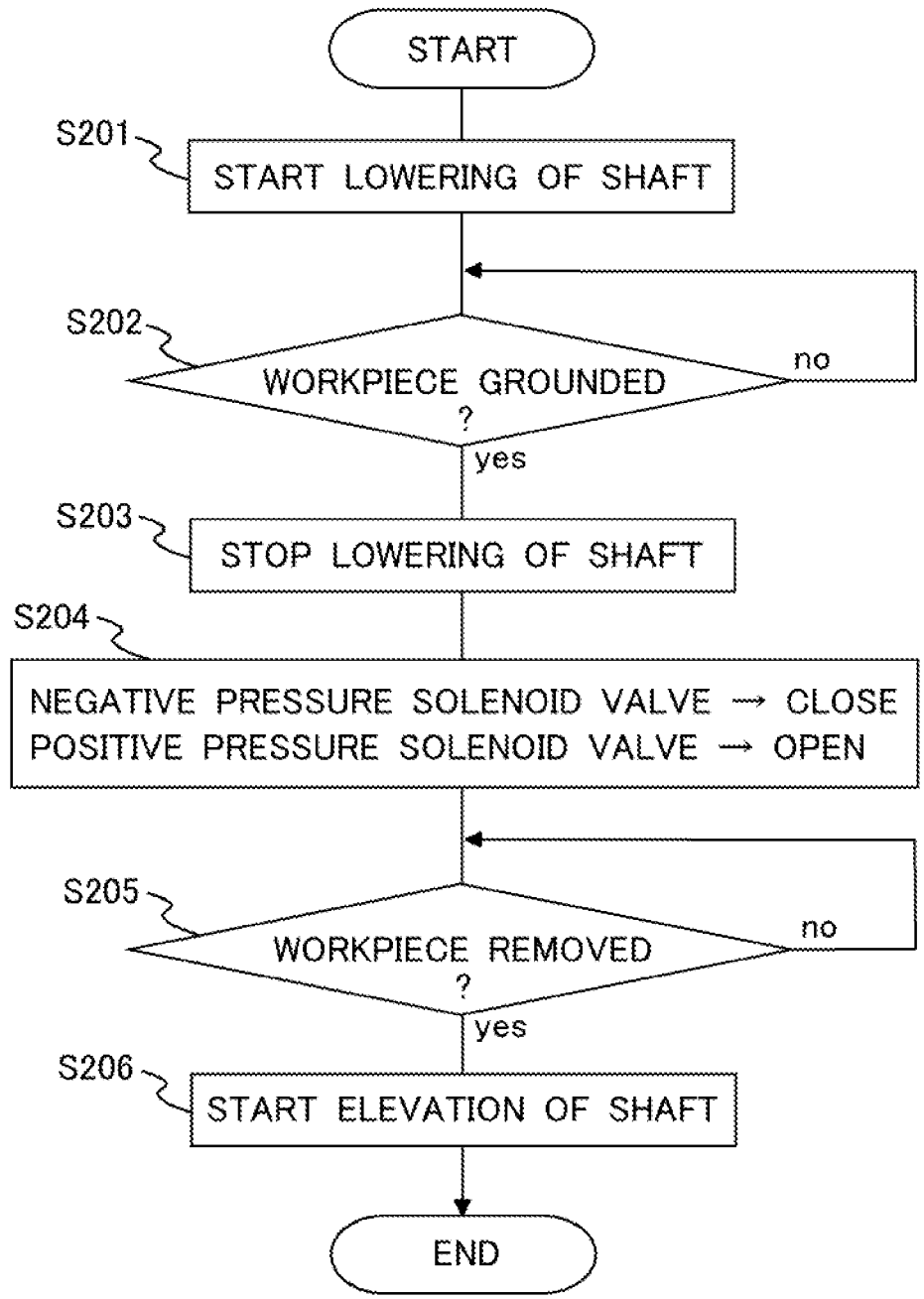

ACTUATOR SYSTEM

TECHNICAL FIELD

The present invention relates to an actuator system.

BACKGROUND ART

An actuator that picks up and places a workpiece is known in which a negative pressure is applied to an interior of a shaft in a state where a tip of the hollow shaft is in contact with the workpiece, to suction the workpiece to the tip of the shaft (e.g., see Patent Document 1).

CITATION LIST

Patent Literature

Patent Document 1: Japanese Patent Laid-Open No. 2009-164347

SUMMARY OF INVENTION

Technical Problem

When picking up a workpiece with such an actuator as in a conventional art described above, the fact that a tip of a shaft is in contact with the workpiece or that the workpiece is suctioned to the tip of the shaft has to be sensed, for example, and a position of the shaft, a pressure in the shaft, or the like has to be controlled based on such a sensing result.

Now, when a control device such as a programmable logic controller (PLC) that is connected to the actuator over a communication network controls the position of the shaft or the pressure in the shaft, control signals that are generated based on sensing results from various sensors are transmitted from the control device to the actuator over the communication network, in addition to the sensing results from the various sensors being transmitted from the actuator to the control device over the communication network, and transmission/reception of various signals between the control device and the actuator possibly takes some time. This may result in an increase in a time from when sensing is performed by various sensors until when control according to the sensing results is reflected in operation of the actuator. As a result, a tact time may be increased, or a workpiece may be damaged.

An object of the present invention, which has been made in view of such actual situations as described above, is to provide a technology related to a control system of an actuator for picking up workpieces, the technology being capable of contributing to shortening tact time and reducing damages to workpieces.

Solution to Problem

An actuator system according to the present invention includes:

an actuator including a movable member that is a member that is movable in an axial direction, the movable member including a tip that is capable of holding a workpiece, the actuator being configured to pick up the workpiece by moving the movable member in the axial direction such that the tip of the movable member is moved to a predetermined position, and by generating a holding force at the tip of the movable member such that the workpiece is held by the tip;

an external force detection sensor being configured to detect a physical quantity that is correlated with an external force that is applied to the workpiece;

a head unit that is connected to the actuator and the external force detection sensor without a communication network, the head unit being configured to cause the actuator to perform a pickup operation of the workpiece, by controlling movement of the movable member in the axial direction and/or the holding force at the tip of the shaft based on a sensing result from the external force detection sensor, when a pickup request signal that is a signal requesting pickup of the workpiece is received; and a control device that is connected to the head unit over the communication network, the control device being configured to transmit the pickup request signal to the head unit.

Advantageous Effects of Invention

According to the present invention, tact time may be shortened and damages to workpieces may be reduced in relation to a control system of an actuator for picking up workpieces.

BRIEF DESCRIPTION OF DRAWINGS

FIG. 1 is a diagram illustrating a schematic configuration of an actuator system according to a present embodiment.

FIG. 2 is an appearance view of an actuator according to an embodiment.

FIG. 3 is a schematic configuration view illustrating an inner structure of the actuator according to the embodiment.

FIG. 4 is a cross-sectional view illustrating a schematic configuration including a shaft housing and a tip of a shaft according to the embodiment.

FIG. 5 is a flowchart schematically illustrating a flow of data that is transmitted/received between structural elements of the actuator system, and a flow of processes performed by the structural elements.

FIG. 6 is a flowchart illustrating a flow of a pickup process that is performed by a head circuit.

FIG. 7 is a flowchart illustrating a flow of a placement process that is performed by the head circuit.

DESCRIPTION OF EMBODIMENTS

An actuator system according to the present invention includes an actuator, an external force detection sensor, a head unit, and a control device. The actuator includes a movable member that is movable in an axial direction. A tip of the movable member is capable of holding a workpiece. As a method of holding the workpiece, a method of causing the workpiece to be suctioned to the tip of the movable member by generating a negative pressure in the tip, a method of gripping the workpiece by attaching a gripper, a manipulator or the like to the tip of the movable member, and the like may be used. The actuator also includes an external force detection sensor that detects a physical quantity that is correlated with an external force that is applied to the workpiece when the tip of the movable member holds the workpiece. The actuator is capable of controlling movement of the movable member in the axial direction and/or a holding force at the tip of the movable member, based on a sensing result from the external force detection sensor.

In the case where a workpiece is to be picked up by the actuator described above, the holding force is generated at the tip of the movable member such that the workpiece is held at the tip. Then, the workpiece may be picked up by moving the movable member upward in the axial direction in a state where the workpiece is held at the tip of movable member. Additionally, in the process of increasing the holding force at the tip of the movable member such that the workpiece is held at the tip, if a time from when the holding force at the tip reaches an appropriate holding force to when the holding force stops increasing becomes long, a tact time is possibly increased or the tip of the movable member or the workpiece is possibly damaged. Accordingly, when the holding force at the tip of the movable member reaches an appropriate holding force, the holding force has to be swiftly stopped from increasing, by swiftly determining, based on the sensing result from the external force detection sensor, that the holding force at the tip of the movable member reached an appropriate holding force, and also, movement of the movable member upward in the axial direction has to be swiftly started.

Here, if movement of the movable member in the axial direction or the holding force at the tip of the movable member is controlled by a control device, such as a PLC, that is connected to the actuator over a communication network, the sensing result from the external force detection sensor is transmitted from the actuator side to the control device over the communication network, and thus, it may take time for the control device to acquire the sensing result from the external force detection sensor. This may result in an unnecessary increase in the tact time, or in damages to the tip of the movable member and the workpiece. Such problems are notable in a configuration where the actuator generates a negative pressure in the tip of the movable member so as to cause the workpiece to be suctioned to the tip.

In the configuration where a negative pressure is generated in the tip of the movable member such that the workpiece is suctioned to the tip, the movable member is a shaft that is movable in the axial direction, the shaft including a hollow part in the tip, for example. In this case, the actuator is configured to pick up the workpiece by causing the shaft to move in the axial direction such that the tip of the shaft is moved to a position (a predetermined position) where the tip comes in contact with the workpiece and by generating a negative pressure in the hollow part such that the workpiece is suctioned to the tip of the shaft, for example. Moreover, for example, the external force detection sensor includes a load detection sensor and a suction detection sensor, the load detection sensor being provided at a transmission member that is a member configured to transmit power for moving the shaft in the axial direction to the shaft, and being configured to detect a load that is applied to the shaft, the suction detection sensor being attached to an air passage that is a passage through which air sucked out from the hollow part of the shaft flows when the negative pressure is applied to the hollow part, and being configured to detect that the workpiece is suctioned to the tip of the shaft.

With the actuator configured in the above manner, whether or not the tip of the shaft is in contact with the workpiece may be determined based on a sensing result from the load detection sensor, for example. Furthermore, with the actuator configured in the above manner, whether or not the workpiece is suctioned to the tip of the shaft may be determined based on a sensing result from the suction detection sensor. In the case where the workpiece is to be picked up by such an actuator, first, the shaft is moved downward in the axial direction from above a position where the workpiece is placed, and the tip of the shaft is made to contact the workpiece. Additionally, if the shaft keeps moving downward in the axial direction after the tip of the shaft contacts the workpiece, an excessive load will be applied to the tip of the shaft and the workpiece, and the tip of the shaft and the workpiece are possibly damaged. Accordingly, when the tip of the shaft contacts the workpiece, such contact between the tip of the shaft and the workpiece has to be swiftly determined from a sensing result from the load detection sensor, and movement of the shaft downward in the axial direction has to be swiftly stopped.

Here, if movement of the shaft in the axial direction is controlled by the control device that is connected to the actuator over the communication network, the sensing result from the load detection sensor is transmitted from the actuator side to the control device over the communication network, and thus, it may take time for the control device to acquire the sensing result from the load detection sensor. This possibly increases a time lag from a time point when the tip of the shaft contacts the workpiece to a time point when the control device determines such contact between the tip of the shaft and the workpiece. Moreover, if a control signal (a stop request) for causing downward movement of the shaft in the axial direction to be stopped is transmitted from the control device to the actuator over the communication network after the control device determines contact between the tip of the shaft and the workpiece, it may take time for the actuator to receive the stop request. This possibly increases a time lag from the time point when the control device determines contact between the tip of the shaft and the workpiece to a time point when the actuator starts an operation according to the stop request. Therefore, if movement of the shaft in the axial direction is controlled by the control device that is connected to the actuator over the communication network, a time from the time point when the tip of the shaft contacts the workpiece to a time point when movement of the shaft downward in the axial direction is stopped may be increased, thereby allowing the shaft to keep moving downward in the axial direction even after the tip of the shaft contacts the workpiece and possibly damaging the tip of the shaft and the workpiece.

Furthermore, in the case where a workpiece is to be picked up by the actuator described above, the workpiece is suctioned to the tip of the shaft by generating a negative pressure in the tip in a state where the tip is in contact with the workpiece. Then, the workpiece may be picked up by moving the shaft upward in the axial direction in a state where the workpiece is suctioned to the tip of the shaft. Additionally, when a time from a time point when the tip of the shaft contacts the workpiece to a time point when suction of air inside the hollow part is started, or a time from a time point when the workpiece is suctioned to the tip of the shaft to a time point when movement of the shaft upward in the axial direction is started becomes long, the tact time is possibly unnecessarily increased. Accordingly, when the tip of the shaft contacts the workpiece, such contact between the tip of the shaft and the workpiece has to be swiftly determined from a sensing result from the load detection sensor, and also, suction of air inside the hollow part has to be swiftly started. Then, when the workpiece is suctioned to the tip of the shaft, that the workpiece is suctioned to the tip of the shaft has to be swiftly determined from a sensing result from the suction detection sensor, and also, movement of the shaft upward in the axial direction has to be swiftly started.

Here, if movement of the shaft in the axial direction and pressure in the hollow part are controlled by the control device that is connected to the actuator over the communication network, the time lag from the time point when the tip of the shaft contacts the workpiece to the time point when the control device determines such contact between the tip of the shaft and the workpiece is possibly increased, as described above, and also, a time lag from the time point when the control device determines contact between the tip of the shaft and the workpiece to the time point when the actuator starts suction of the air inside the hollow part is possibly increased. Moreover, because a sensing result from the suction detection sensor is transmitted from the actuator side to the control device over the communication network, it may take time for the control device to acquire the sensing result from the suction detection sensor. This possibly increases a time lag from the time point when the workpiece is suctioned to the tip of the shaft to the time point when the control device determines suction of the workpiece to the tip of the shaft. Then, if a control signal (an elevation request) for causing movement of the shaft upward in the axial direction to be started is transmitted from the control device to the actuator over the communication network after the control device determines suction of the workpiece to the tip of the shaft, it may take time for the actuator to receive the elevation request. This possibly increases a time lag from the time point when the control device determines suction of the workpiece to the tip of the shaft to a time point when the actuator starts an operation according to the elevation request. Therefore, if movement of the shaft in the axial direction and pressure in the hollow part are controlled by the control device that is connected to the actuator over the communication network, the tact time is possibly unnecessarily increased.

In view of various problems as described above, with the actuator system according to the present invention, the head unit that is connected without the communication network to the actuator, the load detection sensor, and the suction detection sensor is disposed between the actuator and the control device, and the head unit is caused to control movement of the shaft in the axial direction and pressure in the hollow part based on sensing results from the load detection sensor and the suction detection sensor. Accordingly, the control device does not include a function of controlling movement of the shaft in the axial direction and pressure in the hollow part, but incudes a function of transmitting a signal (a pickup request signal) requesting pickup of a workpiece to the head unit over the communication network. With the actuator system configured in such a manner, a workpiece may be picked up through transmission/reception of signals between the actuator side and the head unit, and various time lags as described above may be reduced. As a result, in the case where the shaft is to be moved downward in the axial direction to pick up a workpiece, the time from the time point when the tip of the shaft contacts the workpiece to the time point when movement of the shaft downward in the axial direction is stopped is shortened, thereby preventing the shaft from keep moving downward in the axial direction even after the tip of the shaft contacts the workpiece, and thus, the tip of the shaft and the workpiece may be prevented from being damaged. Furthermore, because the time from the time point when the shaft contacts the workpiece to the time point when suction of air inside the hollow part is started and the time from the time point when the workpiece is suctioned to the tip of the shaft to the time point when movement of the shaft upward in the axial direction is started may be shortened, the tact time may be prevented from being unnecessarily increased.

Hereinafter, specific examples of the present invention will be described with reference to the drawings. A dimension, material, shape, relative arrangement and the like of a component described in the present example do not intend to restrict a technical scope of the invention unless otherwise described.

EMBODIMENT (System Configuration)

FIG. 1 is a diagram illustrating a schematic configuration of an actuator system 800 according to the present invention. The actuator system 800 includes an actuator 1 that performs pickup and placement of a workpiece, a movement device 801 that changes a position of the actuator 1, a control device (a PLC) 802 that controls the movement device 801, and a controller 803 that controls the actuator 1.

(Movement Device 801)

The movement device 801 is a motion guide device that supports the actuator 1 while allowing the actuator 1 to move in a first horizontal axis direction and a second horizontal axis direction orthogonal to the first horizontal axis direction. Additionally, in the following, the first horizontal axis will be referred to as "X-axis", and the second horizontal axis as "Y-axis". As illustrated in FIG. 1, the movement device 801 includes a first rail 801a extending in an X-axis direction, a first carriage 810a that is assembled with the first rail 801a in a manner capable of relative movement in the X-axis direction, and a first drive device 811a that moves the first carriage 810a relative to the first rail 801a in the X-axis direction. The movement device 801 further includes a second rail 801b extending in a Y-axis direction, a second carriage 810b that is assembled with the second rail 801b in a manner capable of relative movement in the Y-axis direction, and a second drive device 811b that moves the second carriage 810b relative to the second rail 801b in the Y-axis direction. The actuator 1 is fixed to the first carriage 810a, and a base end side of the first rail 801a is fixed to the second carriage 810b. The first drive device 811a and the second drive device 811b of the movement device 801 are connected to the PLC 802 over a network N1. The network N1 here is a communication network such as a wide area network (WAN) or a local area network (LAN), for example. Positions of the actuator 1 in the X-, Y-axis directions may be changed by the PLC 802 controlling the first drive device 811a and the second drive device 811b over the communication network. Additionally, the configuration of the movement device 801 is not limited to the example illustrated in FIG. 1, and for example, the positions of the actuator 1 in the X-, Y-axis directions may be changed by using a device that rotates the first rail 801a, instead of the second rail 801b. In short, the movement device 801 may adopt other configurations that use existing devices so long as the positions of the actuator 1 in the X-, Y-axis directions can be changed.

(Actuator 1)

FIG. 2 is an appearance view of an actuator 1 according to the present embodiment. The actuator 1 includes a housing 2 having a substantially rectangular parallelepiped outer shape, and a lid 200 is attached to the housing 2. FIG. 3 is a schematic configuration view illustrating an inner structure of the actuator 1 according to the present embodiment. A part of a shaft 10 is housed within the housing 2. The shaft 10 is formed to be hollow on a tip 10A side. In a material of the shaft 10 and the housing 2, for example, a metal (e.g., aluminum) may be used, or a resin or the like may be used. Note that in the following description, an X-Y-Z orthogonal coordinate system will be set, and positions of respective members will be described with reference to this X-Y-Z orthogonal coordinate system. A long side direction of the largest surface of the housing 2, i.e., a direction of a central axis 100 of the shaft 10 is a Z-axis direction, a short side direction of the largest surface of the housing 2 is an X-axis direction, and a direction that is orthogonal to the largest surface of the housing 2 is a Y-axis direction. These X-axis direction and Y-axis direction are same directions as the X-axis direction and the Y-axis direction illustrated in FIG. 1 described above. Furthermore, the Z-axis direction is a direction orthogonal to a surface including the X-axis and the Y-axis, and is, in the present example, a perpendicular direction. Note that hereinafter, upper sides in the Z-axis direction in FIGS. 2 and 3 are upper sides of the actuator 1, and lower sides in the Z-axis direction in FIGS. 2 and 3 are lower sides of the actuator 1. Furthermore, right sides in the X-axis direction in FIGS. 2 and 3 are right sides of the actuator 1, and left sides in the X-axis direction in FIGS. 2 and 3 are left sides of the actuator 1. Additionally, front sides in the Y-axis direction in FIGS. 2 and 3 are front sides of the actuator 1, and back sides in the Y-axis direction in FIGS. 2 and 3 are back sides of the actuator 1. The housing 2 is formed such that a dimension in the Z-axis direction is larger than a dimension in the X-axis direction, and a dimension in the X-axis direction is larger than a dimension in the Y-axis direction. In the housing 2, a region corresponding to one surface (a front surface in FIG. 2) orthogonal to the Y-axis direction is open, and this opening is closed with the lid 200. The lid 200 is fixed to the housing 2 with, for example, screws.

The housing 2 houses therein a rotating motor 20 that rotates the shaft 10 about the central axis 100, a linear motion motor 30 that moves the shaft 10 relatively straight in a direction along the central axis 100 (i.e., the Z-axis direction) relative to the housing 2, and an air control mechanism 60. Furthermore, a shaft housing 50 into which the shaft 10 is inserted is attached to a lower end face 202 of the housing 2 in the Z-axis direction. In the housing 2, a recess 202B is formed to be recessed from the lower end face 202 toward an interior of the housing 2, and a part of the shaft housing 50 is inserted into the recess 202B. A through hole 2A in the Z-axis direction is formed in an upper end of the recess 202B in the Z-axis direction, and the shaft 10 is inserted into the through hole 2A and the shaft housing 50. The tip 10A of the shaft 10 on the lower side in the Z-axis direction protrudes outward from the shaft housing 50. The shaft 10 is provided at a center of the housing 2 in the X-axis direction and a center of the housing in the Y-axis direction. That is, the shaft 10 is provided such that a central axis extending in the Z-axis direction through the center of the housing 2 in the X-axis direction and the center of the housing in the Y-axis direction is superimposed on the central axis 100 of the shaft 10. The shaft 10 is moved straight in the Z-axis direction by the linear motion motor 30, and is rotated about the central axis 100 by the rotating motor 20.

A base end 10B side of the shaft 10 that is an end on a side opposite to the tip 10A (an upper end in the Z-axis direction) is housed in the housing 2, and connected to an output shaft 21 of the rotating motor 20. The rotating motor 20 rotatably supports the shaft 10. A central axis of the output shaft 21 of the rotating motor 20 coincides with the central axis 100 of the shaft 10. The rotating motor 20 includes, in addition to the output shaft 21, a stator 22, a rotor 23 that rotates in the stator 22, and a rotary encoder 24 that detects a rotation angle of the output shaft 21. The rotor 23 rotates relative to the stator 22, and the output shaft 21 and the shaft 10 also rotate in conjunction with the stator 22.

The linear motion motor 30 includes a stator 31 fixed to the housing 2, and a mover 32 that relatively moves in the Z-axis direction relative to the stator 31. The linear motion motor 30 is, for example, a linear motor. The stator 31 is provided with a plurality of coils 31A, and the mover 32 is provided with a plurality of permanent magnets 32A. The coils 31A are arranged at a predetermined pitch in the Z-axis direction, and a plurality of sets of three coils 31A of U, V, and W-phases are provided. In the present embodiment, a three-phase armature current is applied to the coils 31A of the U, V, and W-phases to generate a straight moving magnetic field, and the mover 32 is straight moved relative to the stator 31. The linear motion motor 30 is provided with a linear encoder 38 that detects a relative position of the mover 32 to the stator 31. Note that in place of the above configuration, the stator 31 may be provided with a permanent magnet, and the mover 32 may be provided with a plurality of coils.

The mover 32 of the linear motion motor 30 is coupled to the stator 22 of the rotating motor 20 via a linear motion table 33. The linear motion table 33 is movable with movement of the mover 32 of the linear motion motor 30. The movement of the linear motion table 33 is guided in the Z-axis direction by a linear motion guide device 34. The linear motion guide device 34 includes a rail 34A fixed to the housing 2, and a slider block 34B attached to the rail 34A. The rail 34A is configured to extend in the Z-axis direction, and the slider block 34B is configured to be movable along the rail 34A in the Z-axis direction.

The linear motion table 33 is fixed to the slider block 34B, and is movable together with the slider block 34B in the Z-axis direction. The linear motion table 33 is coupled to the mover 32 of the linear motion motor 30 via two coupling arms 35. The two coupling arms 35 couple opposite ends of the mover 32 in the Z-axis direction to opposite ends of the linear motion table 33 in the Z-axis direction. Furthermore, the linear motion table 33 is coupled, on a central side than the opposite ends, to the stator 22 of the rotating motor 20 via two coupling arms 36 (corresponding to the transmission members of the present invention). Note that the coupling arm 36 on the upper side in the Z-axis direction will be referred to as a first arm 36A, and the coupling arm 36 on the lower side in the Z-axis direction will be referred to as a second arm 36B. Furthermore, the first arm 36A and the second arm 36B will be referred to simply as the coupling arms 36 when the arms are not distinguished. For the stator 22 of the rotating motor 20, since the linear motion table 33 is coupled to the stator 22 of the rotating motor 20 via the coupling arms 36, the stator 22 of the rotating motor 20 also moves with the movement of the linear motion table 33. The coupling arm 36 has a quadrangular cross section. A strain gauge 37 (corresponding to the load detection sensor of the present invention) is fixed to a surface of each coupling arm 36 which faces upward in the Z-axis direction. Note that the strain gauge 37 fixed to the first arm 36A will be referred to as a first strain gauge 37A, and the strain gauge 37 fixed to the second arm 36B will be referred to as a second strain gauge 37B. The first strain gauge 37A and the second strain gauge 37B will be referred to simply as the strain gauges 37 when the gauges are not distinguished. Note that two strain gauges 37 of the present embodiment are provided on surfaces of the coupling arms 36 which face upward in the Z-axis direction, respectively. In place of the surfaces, the gauges may be provided on surfaces of the coupling arm 36 that face downward in the Z-axis direction.

The air control mechanism 60 is a mechanism to generate a positive pressure or a negative pressure at the tip 10A of the shaft 10. That is, the air control mechanism 60 sucks air in the shaft 10 during pickup of a workpiece W, to generate the negative pressure at the tip 10A of the shaft 10. Consequently, the workpiece W is suctioned to the tip 10A of the shaft 10. Furthermore, the air control mechanism 60 supplies air into the shaft 10 during placement of the workpiece W, to generate the positive pressure at the tip 10A of the shaft 10. Thus, the workpiece W that is suctioned to the tip 10A of the shaft 10 is removed from the tip 10A.

The air control mechanism 60 includes a positive pressure passage 61A (see a dashed chain line) through which positive pressure air flows, a negative pressure passage 61B (see a double-dashed chain line) through which negative pressure air flows, and a shared passage 61C (see a broken line) shared by the positive pressure air and the negative pressure air. The positive pressure passage 61A has one end connected to a positive pressure connector 62A provided on an upper end face 201 of the housing 2 in the Z-axis direction, and the positive pressure passage 61A has the other end connected to a solenoid valve for positive pressure (hereinafter, referred to as a positive pressure solenoid valve 63A). The positive pressure solenoid valve 63A is opened and closed by an after-described head circuit 7. Note that the positive pressure passage 61A has one end portion constituted of a tube 610, and the other end portion constituted of a hole made in a block 600. The positive pressure connector 62A extends through the upper end face 201 of the housing 2 in the Z-axis direction, and the positive pressure connector 62A is connected to an external tube linked to an air discharging pump or the like.

The negative pressure passage 61B has one end connected to a negative pressure connector 62B provided on the upper end face 201 of the housing 2 in the Z-axis direction, and the negative pressure passage 61B has the other end connected to a solenoid valve for negative pressure (hereinafter, referred to as a negative pressure solenoid valve 63B). The negative pressure solenoid valve 63B is opened and closed by the after-described head circuit 7. Note that the negative pressure passage 61B has one end portion constituted of a tube 620, and the other end portion constituted of a hole made in the block 600. The negative pressure connector 62B extends through the upper end face 201 of the housing 2 in the Z-axis direction, and the negative pressure connector 62B is connected to an external tube linked to an air sucking pump or the like.

The shared passage 61C is constituted of a hole made in the block 600. The shared passage 61C has one end branching into two to be connected to the positive pressure solenoid valve 63A and the negative pressure solenoid valve 63B, and the shared passage 61C has the other end connected to an air flow passage 202A that is a through hole formed in the housing 2. The air flow passage 202A communicates with the shaft housing 50. The negative pressure solenoid valve 63B is opened and the positive pressure solenoid valve 63A is closed, to communicate between the negative pressure passage 61B and the shared passage 61C, thereby generating the negative pressure in the shared passage 61C. Then, air is sucked from the shaft housing 50 through the air flow passage 202A. On the other hand, the positive pressure solenoid valve 63A is opened and the negative pressure solenoid valve 63B is closed, to communicate between the positive pressure passage 61A and the shared passage 61C, thereby generating the positive pressure in the shared passage 61C. Then, air is supplied into the shaft housing 50 through the air flow passage 202A.

The shared passage 61C is provided with the suction detection sensor according to the present invention. That is, the shared passage 61C is provided with a pressure sensor 64 that detects a pressure of air in the shared passage 61C, and a flow sensor 65 that detects a flow rate of air in the shared passage 61C. Note that the pressure sensor 64 and the flow sensor 65 do not necessarily have to be arranged in the shared passage 61C, and may be provided in the air flow passage 202A. In short, the pressure sensor 64 and the flow sensor 65 may only be arranged in a path through which air flows (the air passage) between the negative pressure solenoid valve 63B and the tip 10A of the shaft 10. Additionally, the suction detection sensor according to the present invention may alternatively be configured from only one of the pressure sensor 64 and the flow sensor 65.

Here, in the actuator 1 illustrated in FIG. 3, the positive pressure passage 61A and the negative pressure passage 61B have a part constituted of a tube, and the other part constituted of a hole made in the block 600. The present invention is not limited to this embodiment, and all the passages may be constituted of tubes, or all the passages may be constituted of holes made in the block 600. This also applies to the shared passage 61C, and the passage may be entirely constituted of a tube, or may be constituted by combined use of the tube. Note that a material of the tube 610 and the tube 620 may be a material such as a resin having flexibility, or may be a material such as a metal that does not have any flexibility. Furthermore, an atmospheric pressure may be supplied, instead of supplying the positive pressure to the shaft housing 50 by use of the positive pressure passage 61A.

Additionally, on the upper end face 201 of the housing 2 in the Z-axis direction, provided are a connector (hereinafter, referred to as an inlet connector 91A) that is an inlet of air for cooling the rotating motor 20 and a connector (hereinafter, referred to as an outlet connector 91B) that is an outlet of air from the housing 2. The inlet connector 91A and the outlet connector 91B extend through the upper end face 201 of the housing 2 so that air can flow through. A tube linked to an air discharge pump or the like is connected to the inlet connector 91A from outside the housing 2, and a tube that discharges air flowing out of the housing 2 is connected to the outlet connector 91B from outside the housing 2. The interior of the housing 2 is provided with a metal pipe (hereinafter, referred to as a cooling pipe 92) through which air for cooling the rotating motor 20 flows, and the cooling pipe 92 has one end connected to the inlet connector 91A. The cooling pipe 92 is formed to extend from the inlet connector 91A in the Z-axis direction to a vicinity of the lower end face 202 of the housing 2, and to curve in the vicinity of the lower end face 202 such that the pipe, at the other end, faces the rotating motor 20. Thus, air is supplied from the lower side in the Z-axis direction into the housing 2, thereby allowing efficient cooling. Furthermore, the cooling pipe 92 extends through the stator 31, to take heat from the coils 31A of the linear motion motor 30. The coils 31A are arranged around the cooling pipe 92, to take more heat from the coils 31A provided in the stator 31.

The upper end face 201 of the housing 2 in the Z-axis direction is connected to a connector 41 including a power supplying wire and a signal line. Furthermore, the housing 2 is provided with the head circuit 7. The wire or signal line pulled from the connector 41 into the housing 2 is connected to the head circuit 7. The head circuit 7 is provided with a central processing unit (CPU), a random access memory (RAM), a read only memory (ROM), and an erasable programmable ROM (EPROM), which are connected to one another via a bus. The CPU loads various programs that are provided from the after-described controller 803 in a work area of the RAM and executes the same, and preforms pickup and placement of the workpiece W by controlling the rotating motor 20, the linear motion motor 30, the positive pressure solenoid valve 63A, the negative pressure solenoid valve 63B and the like through execution of the programs. Furthermore, output signals of the pressure sensor 64, the flow sensor 65, the strain gauge 37, the rotary encoder 24, and the linear encoder 38 are input into the head circuit 7.

FIG. 4 is a cross-sectional view illustrating a schematic configuration including the shaft housing 50 and the tip 10A of the shaft 10. The shaft housing 50 includes a housing body 51, two rings 52, a filter 53, and a filter stop 54. In the housing body 51, a through hole 51A is formed into which the shaft 10 is inserted. The through hole 51A extends through the housing body 51 in the Z-axis direction, and an upper end of the through hole 51A in the Z-axis direction communicates with the through hole 2A formed in the housing 2. A diameter of the through hole 51A is larger than an outer diameter of the shaft 10. Consequently, a space is provided between an inner surface of the through hole 51A and an outer surface of the shaft 10. In opposite ends of the through hole 51A, enlarged parts 51B each having a hole diameter enlarged are provided. The rings 52 are fitted in two enlarged parts 51B, respectively. Each ring 52 is formed in a cylindrical shape, and an inner diameter of the ring 52 is slightly larger than the outer diameter of the shaft 10. Consequently, a space is also formed between an inner surface of the ring 52 and the outer surface of the shaft 10. Therefore, the shaft 10 is movable in the Z-axis direction in the ring 52, and the shaft 10 is rotatable about the central axis 100 in the ring 52. However, the space formed between the inner surface of the ring 52 and the outer surface of the shaft 10 is smaller than the space formed between the inner surface of the through hole 51A excluding the enlarged parts 51B and the outer surface of the shaft 10. Note that the ring 52 on the upper side in the Z-axis direction will be referred to as a first ring 52A, and the ring 52 on the lower side in the Z-axis direction will be referred to as a second ring 52B. The first ring 52A and the second ring 52B will be referred to simply as the rings 52 when the rings are not distinguished. In a material of the ring 52, for example, a metal or a resin may be used.

A protrusion 511 protruding in opposite right and left directions in the X-axis direction is formed in a central part of the housing body 51 in the Z-axis direction. In the protrusion 511, a mounting surface 511A is formed which is a surface parallel to the lower end face 202 of the housing 2, the surface coming in contact with the lower end face 202, when the shaft housing 50 is mounted to the lower end face 202 of the housing 2. The mounting surface 511A is a surface orthogonal to the central axis 100. Furthermore, a part 512 that is a part of the shaft housing 50 on the upper side of the mounting surface 511A in the Z-axis direction is formed to fit in the recess 202B formed in the housing 2, when the shaft housing 50 is mounted to the housing 2.

The space is provided between the inner surface of the through hole 51A and the outer surface of the shaft 10 as described above. As a result, in the housing body 51, an inner space 500 is formed which is a space surrounded with the inner surface of the through hole 51A, the outer surface of the shaft 10, a lower end face of the first ring 52A, and an upper end face of the second ring 52B. Furthermore, in the shaft housing 50, a control passage 501 is formed which communicates between an opening of the air flow passage 202A formed in the lower end face 202 of the housing 2 and the inner space 500 to form an air passage. The control passage 501 includes a first passage 501A extending in the X-axis direction, a second passage 501B extending in the Z-axis direction, and a filter part 501C that is a space where the first passage 501A and the second passage 501B are connected and the filter 53 is disposed. The first passage 501A has one end connected to the inner space 500, and the other end connected to the filter part 501C. The second passage 501B has one end opened in the mounting surface 511A and aligned to be connected to the opening of the air flow passage 202A.

Furthermore, the second passage 501B has the other end connected to the filter part 501C. In the filter part 501C, the filter 53 formed in a cylindrical shape is provided. The filter part 501C is formed in a columnar space extending in the X-axis direction such that a central axis coincides with that of the first passage 501A. An inner diameter of the filter part 501C is substantially equal to an outer diameter of the filter 53. The filter 53 is inserted into the filter part 501C in the X-axis direction. After the filter 53 is inserted into the filter part 501C, an end of the filter part 501C which is an insertion port of the filter 53 is closed with the filter stop 54. The other end of the second passage 501B is connected to the filter part 501C from a side of an outer circumferential surface of the filter 53. Furthermore, the other end of the first passage 501A communicates with a central side of the filter 53. Therefore, air flowing through a space between the first passage 501A and the second passage 501B flows through the filter 53. Therefore, foreign matter is captured by the filter 53, even if the foreign matter is sucked together with air into the inner space 500, for example, when the negative pressure is generated at the tip 10A. In the one end of the second passage 501B, a groove 501D is formed to hold sealant.

In vicinities of opposite ends of the protrusion 511 in the X-axis direction, two bolt holes 51G are formed into which bolts are inserted, when the shaft housing 50 is fixed to the housing 2 by use of the bolts. The bolt holes 51G extend through the protrusion 511 in the Z-axis direction and opens in the mounting surface 511A.

A hollow part 11 is formed on the tip 10A side of the shaft 10 such that the shaft 10 is hollow. The hollow part 11 has one end opened at the tip 10A. Furthermore, at the other end of the hollow part 11, a communication hole 12 that communicates between the inner space 500 and the hollow part 11 in the X-axis direction is formed. The communication hole 12 is formed to communicate between the inner space 500 and the hollow part 11, in an entire range of a stroke when the shaft 10 is moved in the Z-axis direction by the linear motion motor 30. Therefore, the tip 10A of the shaft 10 communicates with the air control mechanism 60 through the hollow part 11, the communication hole 12, the inner space 500, the control passage 501, and the air flow passage 202A. Note that the communication hole 12 may be formed in the Y-axis direction in addition to the X-axis direction.

According to the shaft 10 and the shaft housing 50 that are configured as described above, the communication hole 12 always communicates between the inner space 500 and the hollow part 11, even if the shaft 10 is at any position in the Z-axis direction when the linear motion motor 30 is driven to move the shaft 10 in the Z-axis direction. Furthermore, the communication hole 12 always communicates between the inner space 500 and the hollow part 11, even if a rotation angle of the shaft 10 is any angle about the central axis 100 when the rotating motor 20 is driven to rotate the shaft 10 about the central axis 100. Therefore, a communication state between the hollow part 11 and the inner space 500 is maintained even if the shaft 10 is in any state, and hence the hollow part 11 always communicates with the air control mechanism 60. For that reason, air in the hollow part 11 is sucked through the communication hole 12, the inner space

500, the control passage 501, the air flow passage 202A, and the shared passage 61C (these paths correspond to an air passage of the present invention) to the negative pressure passage 61B, regardless of the position of the shaft 10, by closing the positive pressure solenoid valve 63A and opening the negative pressure solenoid valve 63B in the air control mechanism 60. As a result, the negative pressure can be generated in the hollow part 11, regardless of the position of the shaft 10. That is, regardless of the position of the shaft 10, the negative pressure can be generated at the tip 10A of the shaft 10, and hence the workpiece W can be suctioned to the tip 10A of the shaft 10. Note that the space is also formed between the inner surface of the ring 52 and the outer surface of the shaft 10 as described above. However, this space is smaller than a space that forms the inner space 500 (i.e., the space formed between the inner surface of the through hole 51A and the outer surface of the shaft 10). Thus, in the air control mechanism 60, the positive pressure solenoid valve 63A is closed and the negative pressure solenoid valve 63B is opened, so that a flow rate of air flowing through the space between the inner surface of the ring 52 and the outer surface of the shaft 10 can be suppressed, even if air in the inner space 500 is sucked. Consequently, the negative pressure with which the workpiece W may be suctioned to the tip 10A of the shaft 10 can be generated at the tip 10A of the shaft 10. On the other hand, the positive pressure can be generated in the hollow part 11, if the positive pressure solenoid valve 63A is opened and the negative pressure solenoid valve 63B is closed in the air control mechanism 60, regardless of the position of the shaft 10. That is, since the positive pressure can be generated at the tip 10A of the shaft 10, the workpiece W can be quickly removed from the tip 10A of the shaft 10.

(Controller 803)

The controller 803 includes a communication unit 803a, a storage unit 803b, and a control unit 803c. The communication unit 803a is a communication interface through which the controller 803 is connected to the network N1. In the present embodiment, the communication unit 803a receives, over the network N1, a pickup request signal and a placement request signal that are transmitted from the PLC 802. The storage unit 803b stores various programs to be executed by the head circuit 7 of the actuator 1. For example, the storage unit 803b stores a program (a pickup program) defining a control procedure of the actuator 1 (the rotating motor 20, the linear motion motor 30, and the air control mechanism 60) at the time of pickup of the workpiece W, a program (a placement program) defining a control procedure of the actuator 1 at the time of placement of the workpiece W, and the like. The control unit 803c is a device that manages operation of the actuator 1. For example, when the communication unit 803a receives the pickup request signal from the PLC 802, the control unit 803c extracts the pickup program from the storage unit 803b, and transmits the extracted pickup program to the head circuit 7 of the actuator 1. Furthermore, when the communication unit 803a receives the placement request signal from the PLC 802, the control unit 803c extracts the placement program from the storage unit 803b, and transmits the extracted placement program to the head circuit 7 of the actuator 1. The program that is transmitted from the control unit 803c to the head circuit 7 of the actuator 1 is loaded in the work area of the RAM of the head circuit 7 to be executed by the CPU of the head circuit 7, as described above. Then, when pickup or placement of the workpiece W is completed due to execution of the pickup program or the placement program by the head circuit 7, a signal (a pickup completion signal) indicating completion of pickup of the workpiece W or a signal (a placement completion signal) indicating completion of placement of the workpiece W is transmitted from the communication unit 803a of the controller 803 to the PLC 802 over the network N1. Additionally, in the present embodiment, a combination of the controller 803 and the head circuit 7 corresponds to the head unit according to the present invention.

(Operation of System)

An operation of the actuator system 800 according to the present embodiment will be described with reference to FIG. 5. FIG. 5 is a flowchart schematically illustrating a flow of data that is transmitted/received between structural elements of the actuator system 800, and a flow of processes performed by the structural elements.

In FIG. 5, the PLC 802 controls the first drive device 811a and the second drive device 811b of the movement device 801 to move the positions of the actuator 1 in the X-, Y-axis directions to a predetermined pickup position (a position at which a position of the tip 10A of the shaft 10 is immediately above the workpiece W)(S11). At this time, control of the first drive device 811a and the second drive device 811b by the PLC 802 is performed over the network N1. Then, when the positions of the actuator 1 in the X-, Y-axis directions are moved to the predetermined pickup position, the PLC 802 transmits the pickup request signal to the controller 803 (S12).

When the pickup request signal from the PLC 802 is received by the communication unit 803a of the controller 803, the control unit 803c of the controller 803 extracts the pickup program from the storage unit 803b (813), and transmits the extracted pickup program to the head circuit 7 of the actuator 1 (S14).

The head circuit 7 performs a pickup process for the workpiece W by loading the pickup program that is received from the controller 803 in the work area of the RAM and executing the same. The pickup process in the present embodiment is performed based on a processing flow illustrated in FIG. 6. Additionally, in the case where the pickup process is to be performed for the workpiece W, a suction nozzle 70 having a diameter corresponding to a size of the workpiece W is mounted to the tip 10A of the shaft 10. Furthermore, during the pickup of the workpiece W, the positive pressure solenoid valve 63A and the negative pressure solenoid valve 63B are both in a closed state, until the suction nozzle 70 comes in contact with the workpiece W.

In FIG. 6, the head circuit 7 first drives the linear motion motor 30, to start movement (lowering) of the shaft 10 downward in the Z-axis direction (8101). Note that at this time, the positive pressure solenoid valve 63A and the negative pressure solenoid valve 63B are both maintained in the closed state, as described above.

The head circuit 7 determines whether or not the suction nozzle 70 is in contact with the workpiece W (S102). Determination of whether or not the suction nozzle 70 is in contact with the workpiece W is performed based on a sensing result from the strain gauge 37. When the suction nozzle 70 comes in contact with the workpiece W when the shaft 10 is being lowered downward in the Z-axis direction, the workpiece W is abutted against the suction nozzle 70, and an external force is applied to the workpiece W. As a reaction to the external force, a load is applied from the workpiece W to the shaft 10. That is, the shaft 10 receives a load from the workpiece W due to reaction when the shaft 10 is abutted against the workpiece W. The load acts in a direction of generating strain relative to the coupling arm 36. That is, when a load is applied from the workpiece W to the shaft 10, the strain is generated in the coupling arm 36. The strain on the coupling arm 36 is detected by the strain gauge 37. The strain that is detected by the strain gauge 37 has correlation with the load that the shaft 10 receives from the workpiece W. Consequently, the load that is applied from the workpiece W to the shaft 10 can be detected based on a sensing result from the strain gauge 37. Contact of the suction nozzle 70 with the workpiece W may be determined when the load that is applied from the workpiece W to the shaft 10 reaches or exceeds a predetermined load. Note that the predetermined load indicates a threshold by which it is determined that the suction nozzle 70 comes in contact with the workpiece W. Furthermore, the predetermined load may be set as the load with which it is possible to more securely pick up the workpiece W while inhibiting damage on the workpiece W. Additionally, the predetermined load can be changed in accordance with a type of workpiece W.

Here, in a case where the suction nozzle 70 is not in contact with the workpiece W (in a case where negative determination is made in S102), the head circuit 7 repeatedly executes processing of the step S102. On the other hand, in a case where the suction nozzle 70 is in contact with the workpiece W (in a case where affirmative determination is made in S102), the head circuit 7 advances to processing of S103.

In S103, the head circuit 7 stops lowering of the shaft 10 downward in the Z-axis direction, by stopping the linear motion motor 30. Subsequently, the head circuit 7 switches the negative pressure solenoid valve 63B from the closed state to an opened state while maintaining the positive pressure solenoid valve 63A in the closed state (S104). In this case, flow of air sucked out from the hollow part 11 to the negative pressure passage 61B is permitted, to generate the negative pressure at the tip 10A of the shaft 10 and the suction nozzle 70. A force of suctioning the workpiece W (the external force that is applied to the workpiece W) thus acts on the suction nozzle 70.

In S105, the head circuit 7 determines whether or not the workpiece W is appropriately suctioned to the suction nozzle 70. For example, the head circuit 7 may determine that the workpiece W is appropriately suctioned to the suction nozzle 70, on condition that the flow rate detected by the flow sensor 65 is decreased to a predetermined flow rate or smaller and/or that the pressure detected by the pressure sensor 64 is decreased to a predetermined pressure or lower, for example. The predetermined flow rate described herein is a flow rate by which it can be determined that the negative pressure with which the workpiece W may be appropriately suctioned is generated at the suction nozzle 70, if the flow rate detected by the flow sensor 65 decreases to the predetermined flow rate or smaller. Furthermore, the predetermined pressure described herein is a pressure by which it can be determined that the negative pressure with which the workpiece W may be appropriately suctioned is generated at the suction nozzle 70, if the pressure detected by the pressure sensor 64 decreases to the predetermined pressure or lower. Additionally, in a case where the workpiece W is not appropriately suctioned to the suction nozzle 70 (in a case where negative determination is made in S105), the head circuit 7 repeatedly executes the processing of S105. On the other hand, in a case where it is determined that the workpiece W is appropriately suctioned to the suction nozzle 70 (in a case where affirmative determination is made in S105), the head circuit 7 advances to S106.

In S106, the head circuit 7 drives the linear motion motor 30 to start movement (elevation) of the shaft 10 upward in the Z-axis direction. At this time, the workpiece W is elevated together with the suction nozzle 70. Pickup of the workpiece W is thus completed. Additionally, at the time of elevating the shaft 10 upward in the Z-axis direction, the head circuit 7 may change orientation of the workpiece W that is picked up, by rotating the shaft 10 by the rotating motor 20.

Referring back to FIG. 5, when pickup of the workpiece W is complete, a notification indicating that pickup of the workpiece W is complete is issued from the head circuit 7 to the controller 803 (S16).

When the controller 803 receives the pickup completion notification from the head circuit 7, the control unit 803c causes the pickup completion signal to be transmitted from the communication unit 803a to the PLC 802 (817).

When the PLC 802 receives the pickup completion signal transmitted from the controller 803, the PLC 802 controls the first drive device 811a and the second drive device 811b of the movement device 801 to move the positions of the actuator 1 in the X-, Y-axis directions to a predetermined placement position (a position at which the position of the tip 10A of the shaft 10 is immediately above a position where the workpiece W is to be placed; S18). Then, when the positions of the actuator 1 in the X-, Y-axis directions are moved to the predetermined placement position, the PLC 802 transmits the placement request signal to the controller 803 (S19).

When the placement request signal from the PLC 802 is received by the communication unit 803a of the controller 803, the control unit 803c of the controller 803 extracts the placement program from the storage unit 803b (S20), and transmits the extracted placement program to the head circuit 7 of the actuator 1 (S21).

The head circuit 7 performs a placement process for the workpiece W by loading the placement program that is received from the controller 803 in the work area of the RAM and executing the same. The placement process in the present embodiment is performed based on a processing flow illustrated in FIG. 7. Additionally, the positive pressure solenoid valve 63A is closed and the negative pressure solenoid valve 63B is opened from pickup to placement of the workpiece W.

In FIG. 7, the head circuit 7 first drives the linear motion motor 30, to start movement (lowering) of the shaft 10 downward in the Z-axis direction (8201). Then, the head circuit 7 determines whether or not the workpiece W suctioned to the suction nozzle 70 is grounded (S202). Specifically, as with the method of determining whether or not the suction nozzle 70 is in contact with the workpiece W in the pickup process described above, the head circuit 7 detects the load that is applied to the shaft 10, based on a sensing result from the strain gauge 37, and determines whether the detected load is a predetermined load or greater. Then, if the detected load is the predetermined load or greater, the head circuit 7 determines that the workpiece W suctioned to the suction nozzle 70 is grounded.

Here, in a case where the workpiece W suctioned to the suction nozzle 70 is not grounded (in a case where negative determination is made in S202), the head circuit 7 repeatedly executes processing of S202. On the other hand, in a case where the workpiece W suctioned to the suction nozzle 70 is grounded (in a case where affirmative determination is made in S202), the head circuit 7 advances to processing of S203.

In S203, the head circuit 7 stops lowering of the shaft 10 downward in the Z-axis direction, by stopping the linear motion motor 30. Subsequently, the head circuit 7 switches the positive pressure solenoid valve 63A from the closed state to the opened state, and also switches the negative pressure solenoid valve 63B from the opened state to the closed state (S204). In this case, flow of air sucked out from the hollow part 11 to the negative pressure passage 61B is cut off, and flow of air supplied from the positive pressure passage 61A to the hollow part 11 is permitted, and the pressure at the tip 10A of the shaft 10 and the suction nozzle 70 is returned from the negative pressure side to the positive pressure side. The force of suctioning the workpiece W to the suction nozzle 70 is thereby decreased.

In S205, the head circuit 7 determines whether or not the workpiece W is removable from the suction nozzle 70. For example, the head circuit 7 may determine that the workpiece W is removable from the suction nozzle 70, on condition that the pressure detected by the pressure sensor 64 is returned to the positive pressure side. Additionally, in a case where the workpiece W is not in a state of being removable from the suction nozzle 70 (in a case where negative determination is made in S205), the head circuit 7 repeatedly executes the processing of S205. On the other hand, in a case where the workpiece W is in a state of being removable from the suction nozzle 70 (in a case where affirmative determination is made in S205), the head circuit 7 advances to S206.

In S206, the head circuit 7 drives the linear motion motor 30 to start movement (elevation) of the shaft 10 upward in the Z-axis direction. At this time, the workpiece W is removed from the suction nozzle 70 to stay at the position. Placement of the workpiece W is thus completed.

Referring back to FIG. 5, when placement of the workpiece W is complete, a notification indicating that placement of the workpiece W is complete is issued from the head circuit 7 to the controller 803 (823).

When the controller 803 receives the placement completion notification from the head circuit 7, the control unit 803c causes the placement completion signal to be transmitted from the communication unit 803a to the PLC 802 (S24). Additionally, in a case where pickup and placement of workpieces W are to be successively performed, processing of S11 to S24 may be repeatedly performed.

Effects of Configuration of the Present Embodiment

As described above, with the actuator system 800 according to the present embodiment, of a series of processes to be performed by the actuator system 800, the pickup process and the placement process are performed not by the PLC 802 but by the head circuit 7 to shorten the tact time and to reduce damages to the workpiece W. For example, time lags until sensing results from the strain gauge 37, the pressure sensor 64, and the flow sensor 65 are input to the head circuit 7 are smaller than time lags until such sensing results are input to the PLC 802. Furthermore, time lags until signals from the head circuit 7 are input to the linear motion motor 30 and the air control mechanism 60 are smaller than time lags until signals from the PLC 802 are input to such units. Accordingly, when the pickup process and the placement process are performed not by the PLC 802 but by the head circuit 7, a time lag from when the suction nozzle 70 contacts the workpiece W (or when the workpiece W suctioned to the suction nozzle 70 is grounded) to when movement of the shaft 10 downward in the Z-axis direction is stopped may be made small at a time of moving the shaft 10 downward in the Z-axis direction to pick up or place the workpiece W, and the shaft 10 may be prevented from moving downward in the Z-axis direction even after the suction nozzle 70 contacts the workpiece W (or the workpiece W suctioned to the suction nozzle 70 is grounded), and thus, the suction nozzle 70 and the workpiece W may be prevented from being damaged. Moreover, a time lag from when the suction nozzle 70 contacts the workpiece W (or when the workpiece W suctioned to the suction nozzle 70 is grounded) to when suction of air inside the suction nozzle 70 (or supply of air into the suction nozzle 70) is started may be made small, and also, a time lag from when the workpiece W is suctioned to the suction nozzle 70 (or the workpiece W is removed from the suction nozzle 70) to when movement of the shaft 10 upward in the Z-axis direction is started may be made small, and thus, the tact time of the pickup process and the placement process may be prevented from being unnecessarily increased.

<Modifications>

The above embodiment describes a combination of the controller and the head circuit as the head unit according to the present invention, but the head unit according to the present invention may alternatively be implemented by the head circuit alone, by providing a communication unit to the head circuit and storing the pickup program and the placement program in a main memory of the head circuit.

Moreover, in the above embodiment, as the actuator according to the present invention, one that includes a shaft having a hollow part formed on a tip side, and that picks up a workpiece by generating a negative pressure in the hollow part is described, but alternatively, one that includes a movable member such as an arm having a gripper or a manipulator on a tip side, and that picks up a workpiece by gripping the workpiece with the gripper or the manipulator may be used. In this case, a sensor that detects a holding force of the gripper or the manipulator may be used as the external force detection sensor according to the present invention.

REFERENCE SIGNS LIST

1 actuator
2 housing
7 head circuit
10 shaft
10A tip
11 hollow part
20 rotating motor
22 stator
23 rotor
30 linear motion motor
31 stator
32 mover
36 coupling arm
37 strain gauge
50 shaft housing
60 air control mechanism
61B negative pressure passage
61C shared passage
63B negative pressure solenoid valve
64 pressure sensor
65 flow sensor
70 suction nozzle
202A air flow passage
500 inner space
501 control passage
800 actuator system
801 movement device
802 PLC (control device)
803 controller

The invention claimed is:

1. An actuator system comprising:
an actuator including a movable member that is a member that is movable in an axial direction, the movable member including a tip that is capable of holding a workpiece, the actuator being configured to pick up the workpiece by moving the movable member in the axial direction such that the tip of the movable member is moved to a predetermined position, and by generating a holding force at the tip of the movable member such that the workpiece is held by the tip;
a movement device configured to move the actuator between a predetermined pickup position and a predetermined placement position in a direction orthogonal to the axial direction of the movable member,
an external force detection sensor being configured to detect a physical quantity that is correlated with an external force that is applied to the workpiece;
a head unit that is connected to the actuator and the external force detection sensor without a communication network, the head unit being configured to cause the actuator to perform a pickup operation of the workpiece, by controlling movement of the movable member in the axial direction and/or the holding force at the tip of the movable member based on a sensing result from the external force detection sensor, when a pickup request signal that is a signal requesting pickup of the workpiece is received; and
a control device that is connected to the head unit and the movement device over the communication network, the control device being configured to control the movement device to move the actuator between the predetermined pickup position and the predetermined placement position and to transmit the pickup request signal to the head unit.

2. The actuator system according to claim 1, wherein
the movable member is a shaft that is movable in the axial direction, the shaft including a hollow part on a tip side,
the actuator is configured to pick up the workpiece by causing the shaft to move in the axial direction such that the tip of the shaft is moved to the predetermined position that is a position where the tip comes in contact with the workpiece, and by generating a negative pressure in the hollow part such that the workpiece is suctioned to the tip of the shaft, and
the external force detection sensor includes a load detection sensor and a suction detection sensor, the load detection sensor being provided at a transmission member that is a member configured to transmit power for moving the shaft in the axial direction to the shaft, and being configured to detect a load that is applied to the shaft, the suction detection sensor being attached to an air passage that is a passage through which air sucked out from the hollow part of the shaft flows when the negative pressure is applied to the hollow part, and being configured to detect that the workpiece is suctioned to the tip of the shaft.

3. The actuator system according to claim 2, wherein, when the pickup request signal transmitted from the control device is received by the head unit, the head unit performs:
controlling the actuator to move the shaft downward in the axial direction,
determining whether or not the tip of the shaft is in contact with the workpiece, based on a sensing result from the load detection sensor,
controlling the actuator at a time point when the tip of the shaft is determined to have contacted the workpiece, to stop the shaft from moving downward in the axial direction,
controlling the actuator to generate the negative pressure in the hollow part of the shaft,
determining whether or not the workpiece is suctioned to the tip of the shaft, based on a sensing result from the suction detection sensor,
controlling the actuator at a time point when it is determined that the workpiece is suctioned to the tip of the shaft, to move the shaft upward in the axial direction, and
transmitting, to the control device, a pickup completion signal that is a signal indicating completion of pickup of the workpiece.

4. The actuator system according to claim 3, wherein the control device performs:
controlling the movement device to move a position of the actuator in the direction orthogonal to the axial direction of the shaft to the predetermined pickup position,
transmitting the pickup request signal to the head unit when the position of the actuator in the direction orthogonal to the axial direction of the shaft is moved to the predetermined pickup position, and
controlling the movement device to move the position of the actuator in the direction orthogonal to the axial direction of the shaft from the predetermined pickup position to the predetermined placement position, when the pickup completion signal is received from the head unit after the pickup request signal is transmitted to the head unit.

5. The actuator system according to claim 4, wherein
the control device is further configured to transmit, to the head unit, a placement request signal that is a signal requesting placement of the workpiece, when the position of the actuator in the direction orthogonal to the axial direction of the shaft is at the predetermined placement position, and
the head unit performs, when the placement request signal transmitted from the control device is received by the head unit,
controlling the actuator to move the shaft downward in the axial direction,
determining whether or not the workpiece suctioned to the tip of the shaft is grounded, based on a sensing result from the load detection sensor,
controlling the actuator at a time point when it is determined that the workpiece suctioned to the tip of the shaft is grounded, to stop the shaft from moving downward in the axial direction,
controlling the actuator to return a pressure in the hollow part of the shaft to a positive pressure side,
determining whether or not the workpiece is removable from the tip of the shaft, based on a sensing result from the suction detection sensor,
controlling the actuator at a time point when it is determined that the workpiece is removable from the tip of the shaft, to move the shaft upward in the axial direction, and
transmitting, to the control device, a placement completion signal that is a signal indicating completion of placement of the workpiece.

6. The actuator system according to claim 1, wherein
the head unit includes a controller configured to hold a pickup program, and a head circuit configured to cause the actuator to perform the pickup operation of the workpiece,
the controller extracts the pickup program and transmits the pickup program to the head circuit when the pickup request signal is received, and
the head circuit controls the axial movement of the movable member and the holding force at the tip of the movable member according to the pickup program received from the controller.

* * * * *